United States Patent [19]

Maruyama et al.

[11] Patent Number: 5,437,359
[45] Date of Patent: Aug. 1, 1995

[54] PARTS INSERTION MACHINE

[75] Inventors: Shigeaki Maruyama, Kanagawa; Yukio Kawazu, Saitama, both of Japan

[73] Assignee: Sony Corporation, Japan

[21] Appl. No.: 217,721

[22] Filed: Mar. 25, 1994

[30] Foreign Application Priority Data

Mar. 31, 1993 [JP] Japan .................................. 5-074629

[51] Int. Cl.6 ............................................. B65G 43/00
[52] U.S. Cl. ................................. 198/341; 198/345.2; 198/464.3; 198/718; 414/750; 29/701; 29/739; 29/759
[58] Field of Search .................. 198/341, 345.2, 464.3, 198/502.2, 718; 29/407, 701, 707, 709, 711, 712, 729, 739, 759, 833; 414/222, 750

[56] References Cited

U.S. PATENT DOCUMENTS

| | | | |
|---|---|---|---|
| 4,419,384 | 12/1983 | Kane et al. | 198/341 |
| 4,488,633 | 12/1984 | Kampf | 198/341 |
| 4,776,080 | 10/1988 | Christensen | 29/430 |
| 5,005,823 | 4/1991 | Fyler et al. | 414/750 |
| 5,220,715 | 6/1993 | Otani et al. | 198/341 |

FOREIGN PATENT DOCUMENTS

0501551A3  9/1992  European Pat. Off. .
41142841  11/1992  Germany .

Primary Examiner—Joseph E. Valenza
Attorney, Agent, or Firm—Ronald P. Kananen

[57] ABSTRACT

An apparatus and method for feeding a printed wiring board automatically sets a feeding stroke with respect to different types of printed wiring boards and sequentially feeds the boards. In the apparatus for sequentially feeding a printed wiring board to a predetermined position, a sensor is provided for detecting information on the printed wiring board including the size, shape, color, and type of the printed wiring board, whereby a feeding stroke with respect to each of the printed wiring boards is set based upon the information.

11 Claims, 5 Drawing Sheets

PARTS INSERTION MACHINE

BACKGROUND OF THE INVENTION

FIELD OF THE INVENTION

The present invention relates to an apparatus and method for feeding printed wiring boards suitable for use in a mounting machine that automatically mounts electronic parts or other parts onto the printed wiring boards.

DESCRIPTION OF THE RELATED ART

Figure 1:
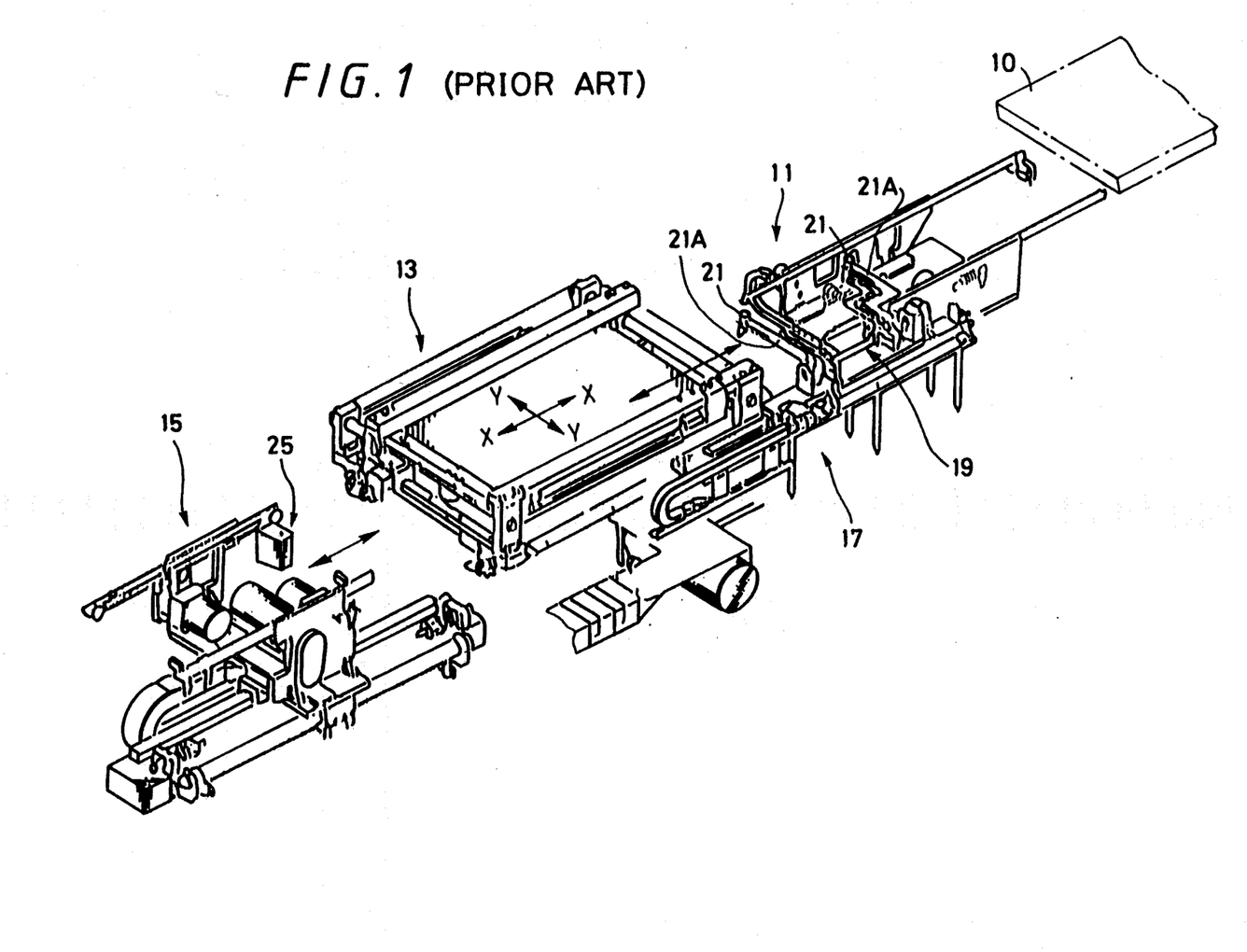
FIG. 1 is a schematic diagram illustrating an example of a conventional printed wiring board exchange apparatus.

FIG. 1 shows a conventional example of a mounting machine that automatically mounts electronic parts on a printed wiring board. In particular, FIG. 1 depicts a device for exchanging a printed wiring board, hereinafter referred to as a printed wiring board exchange device. The printed wiring board exchange device includes a loading unit 11, a unit 13 for positioning a printed wiring board, hereinafter referred to as a printed wiring board positioning unit, an unloading unit 15, and a unit 17 for feeding the printed wiring board, hereinafter referred to as a printed wiring board feeding unit.

A printed wiring board 10 is conveyed by a conveyor belt (not shown) to a tip end of the loading unit 11 from the right side in the drawing. Next, the printed wiring board 10 carried on the loading unit 11 is fed to the printed wiring board positioning unit 13 by the printed wiring board feeding unit 17.

As shown in FIG. 1, the printed wiring board positioning unit 13 has a movable part shiftable in a feeding direction (X direction) of the printed wiring board 10 and in a direction (Y direction) perpendicular thereto, whereby the printed wiring board 10 carried on the printed wiring board positioning unit 13 can be moved by desired distances in the X and Y directions. Thus, the printed wiring board 10 may be positioned accurately at a predetermined position by the printed wiring board positioning unit 13 before the mounting of electronic parts or other parts on the surface thereof.

After the step of mounting the electronic parts on the printed wiring board 10 has been completed, the printed wiring board 10 is fed to the unloading unit 15 by the printed wiring board feeding unit 17. The unloading unit 15 is provided with a passage confirmation sensor 25 which acts to detect that the printed wiring board 10 was fed to the unloading unit 15.

The printed wiring board feeding unit 17 has a movable feeding part 19 which feeds the printed wiring board 10. More specifically, the movable feeding part 19 has a pair of arms 21A each of which is provided at its tip end with a feeding nail 21. When the movable feeding part 19 is moved along its feeding direction, the feeding nails 21 also move in the feeding direction.

Figure 2:
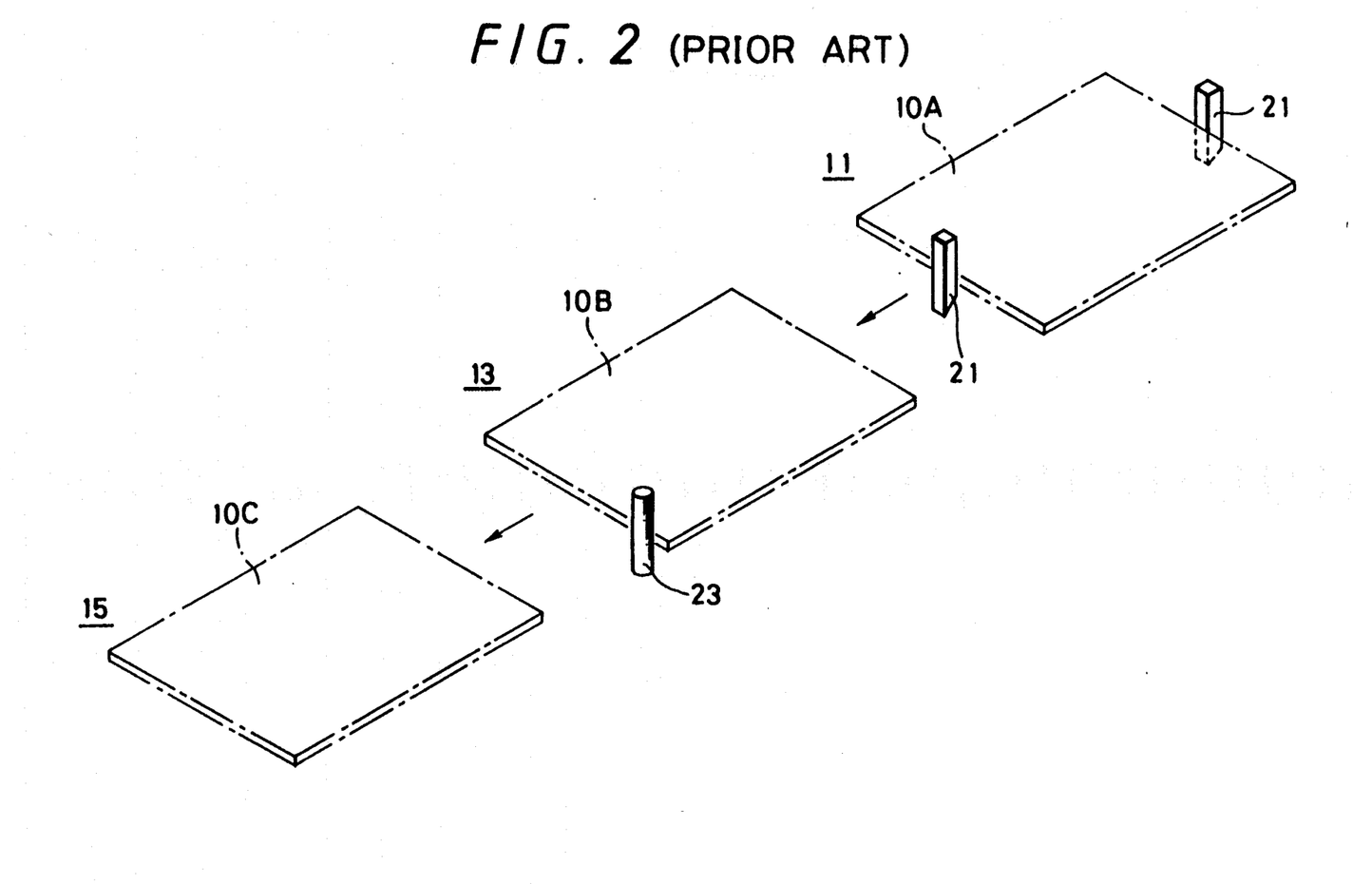
FIG. 2 shows a schematic diagram used to explain the operation of the printed wiring board feeding unit employed in the conventional printed wiring board feeding apparatus.

FIG. 2 illustrates, by one-dot chain lines, a printed wiring board 10A located on the loading unit 11 at its left end, a printed wiring board 10B located on the printed wiring board positioning unit 13, and a printed wiring board 10C located on the unloading unit 15.

In the illustrated example, the printed wiring board 10A located on the loading unit 11 is gripped between the two feeding nails 21 of the feeding part 19. That is, the movable feeding part 19 holds the printed wiring board 10A at its front and back ends by the two feeding nails 21 whereby the printed wiring board 10A will move together with the movable feeding part 19.

As shown in FIG. 2, the printed wiring board positioning unit 13 includes a stopper 23 which acts to stop the printed wiring board 10B fed from the loading unit 11 and to hold the board 10B to prevent it from being fed further toward the unloading unit 15.

Similarly, when the printed wiring board 10B is shifted from the printed wiring board positioning unit 13 to the unloading unit 15, the movable feeding part 19 holds the printed wiring board 10B at its front and back ends by the two feeding nails 21 whereby the printed wiring board 10B moves together with the movable part 19.

However, the conventional printed wiring board feeding unit 17 has not been equipped with such a sensor as to detect information about the printed wiring board 10. The information on the printed wiring board 10 may include such things as, for example, its size, length, shape, type or the like. For this reason, when it is desired to feed different sorts of printed wiring boards 10, an operator must manually adjust the movable feeding part 19 to match it to the printed wiring boards 10 for every different sort of the board.

For example, when the size of the printed wiring board 10 in its feeding direction is changed, the operator must correspondingly change the movement stroke of the feeding nails 21. In this way, it has been difficult to automatically and sequentially feed different types of printed wiring boards 10.

OBJECTS AND SUMMARY OF THE INVENTION

It is an object of the present invention to provide an improved apparatus and method for feeding a printed wiring board in which the aforementioned shortcomings and disadvantages encountered with the related art can be eliminated.

More specifically, it is an object of the present invention to provide an apparatus and method for feeding printed wiring boards which can automatically set a feeding stroke with respect to different types of printed wiring boards and can sequentially feed the printed circuit boards.

According to an aspect of the present invention, a printed wiring board feeding apparatus for sequentially feeding a printed wiring board to a predetermined position comprises a sensor for detecting information about each of the printed wiring boards, such as a size of each printed wiring board; a feeding stroke determining unit for determining a feeding stroke of the printed wiring board based upon the information detected by the sensor; and a feeding unit for feeding the printed wiring board based upon of the feeding stroke determined by the feeding stroke determining unit.

According to another aspect of the present invention, a method for sequentially feeding printed wiring boards of different sizes by predetermined distances comprises the steps of detecting a position of a printed wiring board before the printed wiring board is fed; detecting a size of the printed wiring board in a feeding direction thereof; setting a position of the printed wiring board after the printed wiring board has been fed; and setting a feeding stroke of the printed wiring board based upon the detected positions of the printed wiring board before and after the printed wiring board has been fed and based upon the detected size of the printed wiring board in the feeding direction.

In accordance with the present invention, an apparatus for sequentially feeding a printed wiring board to a predetermined position comprises a sensor for detecting information of the printed wiring board such as the size of the printed wiring board. The apparatus sets a feeding stroke with respect to each of the printed wiring boards based upon the detected information.

Preferably, in the printed wiring board feeding apparatus according to the present invention, a nail engaged with a rear edge of the printed wiring board is provided for feeding the printed wiring board. The sensor is preferably mounted to the nail.

In accordance with the present invention, a method for sequentially feeding printed wiring boards of different sizes by predetermined distances, comprises the steps of detecting a position of the printed wiring board prior to its feeding, detecting a size of the printed wiring board in its feeding direction, setting a position of the printed wiring board after its feeding, and setting a feeding stroke of the printed wiring board based upon the position of the printed wiring board before and after its feeding and based upon the size of the printed wiring board in the feeding direction.

According to the thus arranged present invention, since the movement stroke of the feeding unit is automatically set based upon the information on the printed wiring board detected by the sensor, the printed wiring board can advantageously be fed to a desired position even when the printed wiring board changes in size.

Further, preferably, since the feeding nail is provided with the sensor and the sensor detects information about the printed wiring board during the movement of the feeding nail, the present invention is advantageous in that there is no need for moving only the sensor so as to detect the information on the printed wiring board.

Furthermore, preferably, since the printed wiring board feeding unit is provided with the sensor for reading the information on the printed wiring board and the printed wiring board feeding unit is actuated based on such information, the present invention is advantageous in that the operation of the printed wiring board feeding unit can be automatically controlled even when the printed wiring boards 10 come in different sizes and types.

The preceding and other objects, features, and advantages of the present invention will become apparent from the following detailed description of illustrative embodiments thereof when read in conjunction with the accompanying drawings.

DESCRIPTION OF THE PREFERRED EMBODIMENT

An embodiment of the printed wiring board feeding apparatus according to the present invention will now be described with reference to FIGS. 3 to 5. In these figures, portions or parts identical to those of FIGS. 1 and 2 are marked with the same references and therefore detailed explanation thereof is omitted.

Figure 3:
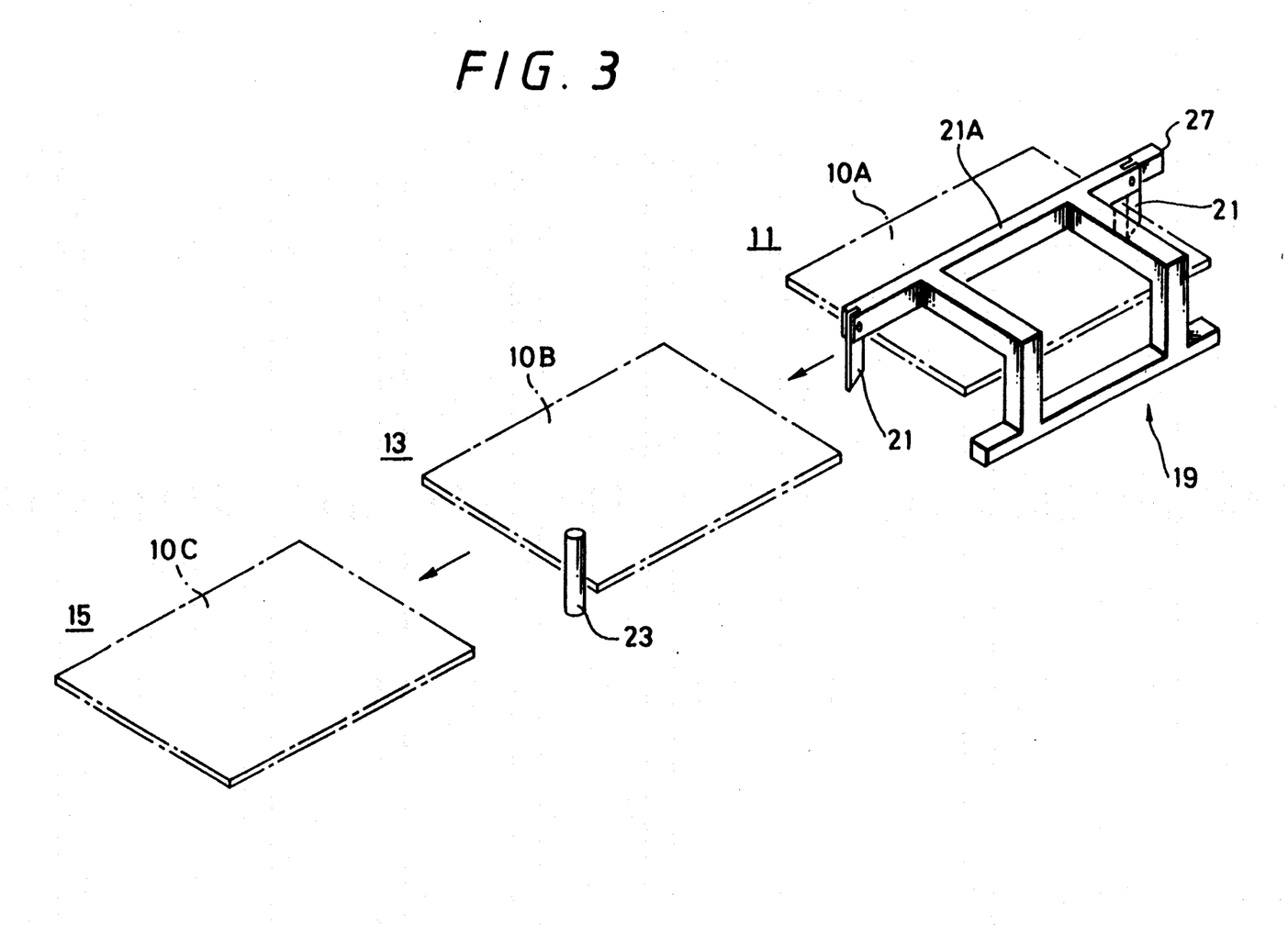
FIG. 3 is a schematic diagram illustrating a major part of an embodiment of a printed wiring board feeding apparatus according to the present invention.

FIG. 3 shows an arrangement of a main part of the embodiment of the printed wiring board feeding apparatus according to the present invention. Referring to FIG. 3, the printed wiring board feeding apparatus includes a movable feeding part 19 having feeding nails 21. The movable feeding nails 21 are attached, e.g., to an arm 21A provided in the movable feeding part 19.

In FIG. 3, printed circuit boards 10A, 10B, and 10C are shown by one-dot chain lines. The printed wiring board 10A is conveyed on a conveyor belt (not shown) to the left end of an loading unit 11, the printed wiring board 10B is fed from the loading unit 11 to the printed wiring board positioning unit 13 by the printed wiring board feeding apparatus, and the printed wiring board 10C is fed from the printed wiring board positioning unit 13 to the unloading unit 15 by the printed wiring board feeding apparatus.

In this embodiment, the printed wiring board feeding apparatus comprises a sensor 27 which acts to detect information on the printed wiring board 10. This information may comprise, for example, a size or length of the printed wiring board in its feeding direction. In addition to the size of the printed wiring board 10, the information may include its shape, model, type, identification, color or other characteristics.

Such a sensor 27 may be constituted by an optical or magnetic sensor for measuring the size of the board, a photo sensor for reading the shape, model, type, or other characteristic of the board, an image processor employing an image pick-up element, or a color sensor for identifying the color of the board.

The sensor 27 is mounted on the printed wiring board feeding apparatus at a proper position thereof. For example, the sensor 27 may be mounted on the movable feeding part 19, and preferably to the feeding nail 21. Alternatively, the sensor 27 may be mounted on a fixed part (not shown) of the printed wiring board feeding unit 17.

The printed wiring board feeding apparatus of this embodiment includes a driving unit for displacing the movable feeding part 19. As such a driving unit, any known actuator unit may be employed which is arranged to move the movable feeding part 19 by a desired distance based upon an instruction signal received from the sensor 27. The driving unit may comprise a pulse motor, a servo motor, as well as other displacement devices.

Operation of the printed wiring board feeding apparatus and sensor 27 of this embodiment will be described also with reference to FIG. 3. In this embodiment, the sensor 27 is attached to the feeding nail 21 and is moved together with the feeding nail 21. Accordingly, when the feeding nail 21 is moved above the printed wiring board 10A, the sensor 27 can detect the information on the printed wiring board 10A.

In operation, the printed wiring board 10A is first conveyed to the left end of the loading unit 11 by the conveyor belt (not shown). The printed wiring board 10A is then fed from the loading unit 11 to the printed wiring board positioning unit 13 by the printed wiring board feeding unit 17. After electronic parts have been mounted on the printed wiring board 10B at the printed wiring board positioning unit 13, the printed wiring board 10B is fed from the printed wiring board positioning unit 13 to the unloading unit 15 by the printed wiring board feeding unit 17. The printed wiring board 10C fed to the unloading unit 15 is discharged to the next step by a conveyor belt (not shown).

When the printed wiring board 10A located at the left end of the loading unit 11 is shifted over to the printed wiring board positioning unit 13, the next printed wiring board 10A is conveyed to the loading unit 11 by the conveyor belt. Accordingly, the movable feeding part 19 having the feeding nail 21 and the sensor 27 is again returned to the loading unit 11. At this time, by returning the feeding part 19, the feeding nail 21 or sensor 27 moves over the next printed wiring board 10A which is located at the left end of the loading unit 11.

Before the printed wiring board 10A moves to the printed wiring board positioning unit 13, the feeding nail 21 attached to the movable feeding part 19 necessarily moves over the printed wiring board 10 along the feeding direction. Thus, with the sensor 27 attached to the feeding nail 21, the sensor 27 can detect a size or any other information relating to the printed wiring board 10A.

The sensor 27 reads the information on the printed wiring board 10A during the movement of the feeding nail 21 over the printed wiring board 10A, whereby it is unnecessary to have only the sensor 27 move in order to detect the size or other information on the printed wiring board 10A. When the sensor 27 is mounted to a fixed part of the printed wiring board feeding unit 17, the sensor 27 can read the information on the printed wiring board 10A during the movement of the printed wiring board 10A.

In this embodiment, the sensor 27 mounted in the printed wiring board feeding apparatus can read the information on the printed wiring board 10A without interfering with the operation of the printed wiring board feeding apparatus. Further, there is no need for providing a separate driving unit for shifting only the sensor 27. The information is detected for each of the printed wiring boards 10A and the printed wiring board feeding apparatus operates based upon the detected information. For example, the size of each printed wiring board 10A is detected and then the movement stroke of the movable feeding part 19 is automatically set for each printed wiring board based on the detected size.

Next, operation of obtaining the movement stroke of the movable feeding part 19 or feeding nail 21, that is, the movement distance of the printed wiring board 10 will be described with reference to FIGS. 4A and 4B. In this embodiment, a stopper 29 is disposed at the left end Of the loading unit 11 so as to define a reference position for the printed wiring board 10A. That is, even when the size of the printed wiring board 10A in its feeding direction differs from a previous printed wiring board, the printed wiring board 10A is positioned at the left end of the loading unit 11 whereby the front edge of the printed wiring board 10A always engages the stopper 29. In other words, all printed wiring boards introduced into the loading unit 11 have their front edges located at the reference stopper 29 position.

In the printed wiring board positioning unit 13, the printed wiring board 10B is positioned relative to either its front end or its back end. When the front end is employed as a reference, the printed wiring board 10B is positioned such that the front edge of the board is located at a predetermined reference position $P_1$. In contrast, when the back end is employed as a reference, the printed wiring board 10B is positioned such that the back edge of the board is located at a predetermined reference position $P_2$. Accordingly, the movement stroke will vary depending on the employment of the front end or the back end as a reference.

Figure 4A:
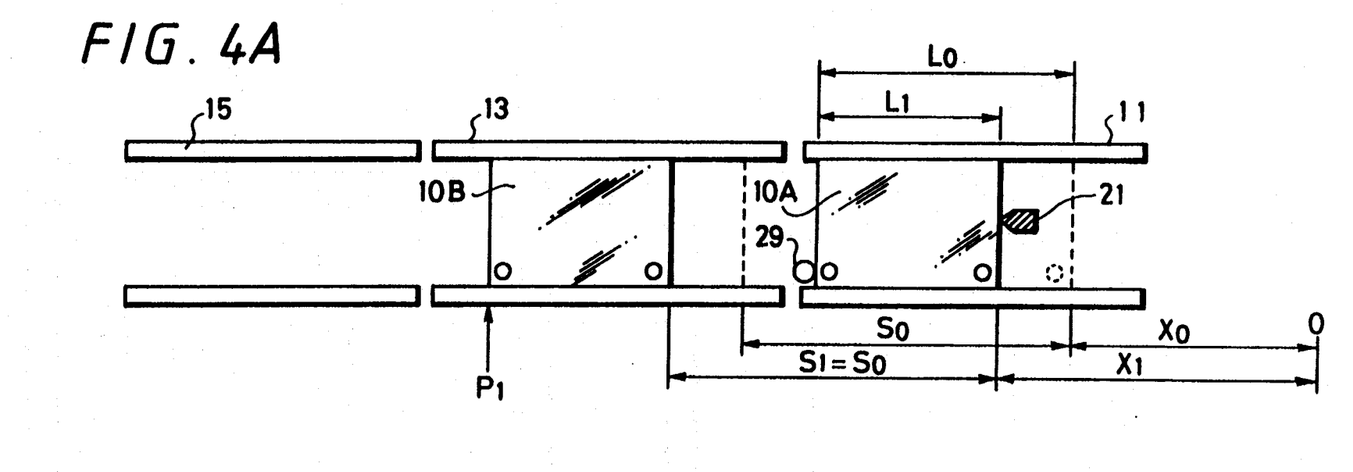
FIGS. 4A and 4B show schematic diagrams used to explain the feeding stroke of a printed wiring board in the embodiment.

Referring to FIG. 4A, explanation will be made as to a method of calculating the movement stroke when the front end is used as a reference. As shown in FIG. 4A, a reference symbol $L_1$ denotes the size of the printed wiring board 10A in its feeding direction where the printed wiring board 10A is located at the left end of the loading unit 11. Further, of the printed wiring boards 10A conveyed by the printed wiring board feeding apparatus, the printed wiring board 10A having a maximum size $L_0$ in the feeding direction is shown by a broken line.

An origin O is set at a suitable position in the right side of the loading unit 11 and a positive X-axis coordinate extends toward the left from the origin O. It is also assumed that the back edge of the printed wiring board having the maximum size $L_0$ has a positional coordinate value of $X_0$ and the back edge of the printed wiring board having the size $L_1$ has a positional coordinate value of $X_1$. Hence, the positional coordinate of $X_1$ at the back edge of the printed wiring board 10A is expressed as $X_1 = X_0 + (L_0 - L_1)$.

Since the loading unit 11 in this case is based on the front end reference, when the printed wiring board positioning unit 13 is also based on the front end reference, the movement stroke of the printed wiring board 10A becomes constant regardless of the size of the printed wiring board 10A in the feeding direction. In other words, assuming that the printed wiring board having the maximum size $L_0$ has a movement stroke $S_0$, then the movement stroke $S_1$ of the printed wiring board having the size $L_1$ is expressed as $S_1 = S_0$.

Figure 4B:
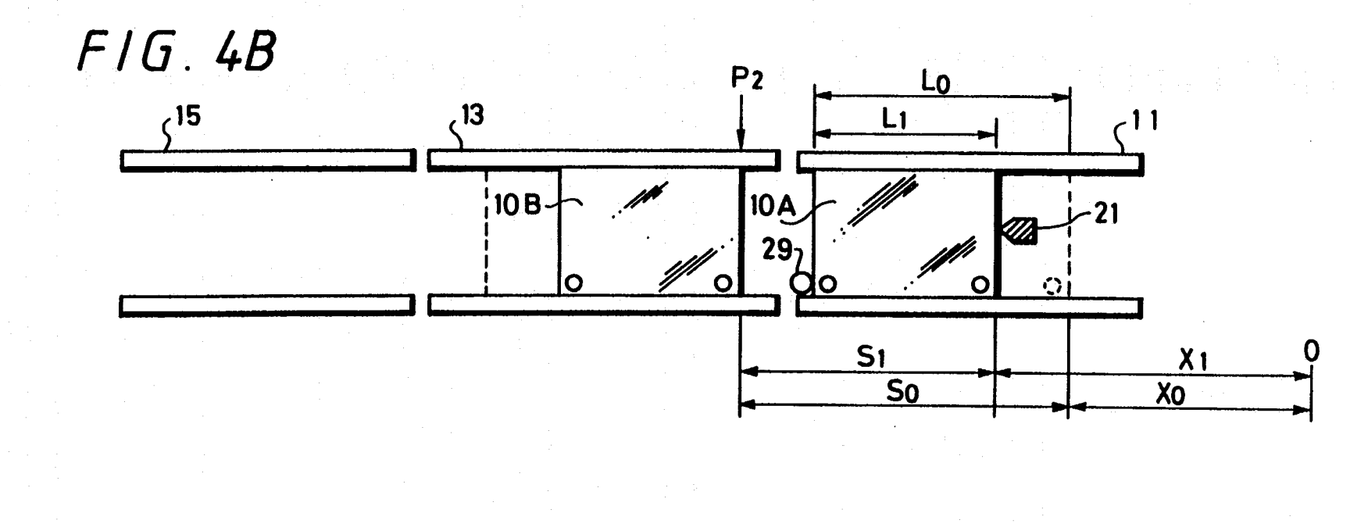

Referring to FIG. 4B, explanation will be made as to a method of calculating the movement stroke when the back end is used as a reference. As with FIG. 4A, the printed wiring board 10A having the size L in its feeding direction is shown by a solid line, while the printed wiring board 10A having the maximum size $L_0$ in its feeding direction is shown by a broken line.

Similarly to FIG. 4A, an origin 0 is set at a suitable position in the right side of the loading unit 11 and positive X-axis coordinate extends toward the left from the origin O. It is also assumed that the back edge of the printed wiring board having the maximum size $L_0$ has a positional coordinate value of $X_0$ and the back edge of the printed wiring board having the size $L_1$ has a positional coordinate value $X_1$. Hence, the positional coordinate $X_1$ at the back edge of the printed wiring board 10A is expressed as $X_1 = X_0 + (L_0 - L_1)$.

Since the loading unit 11 uses the front end as a reference, when the printed wiring board positioning unit 13 uses the back end as a reference, the movement stroke of the printed wiring board 10A varies with the variation in size of the printed wiring board 10A in the feeding direction. In other words, assuming that the printed wiring board 10A having the maximum size $L_0$ has a movement stroke $S_0$, then the movement stroke $S_1$ of the printed wiring board having the size $L_1$ is expressed as $S_1 = S_0 - (L_0 - L_1)$.

Explanation will next be made on the arrangement of a control system for implementing the present invention with reference to FIG. 5.

Figure 5:
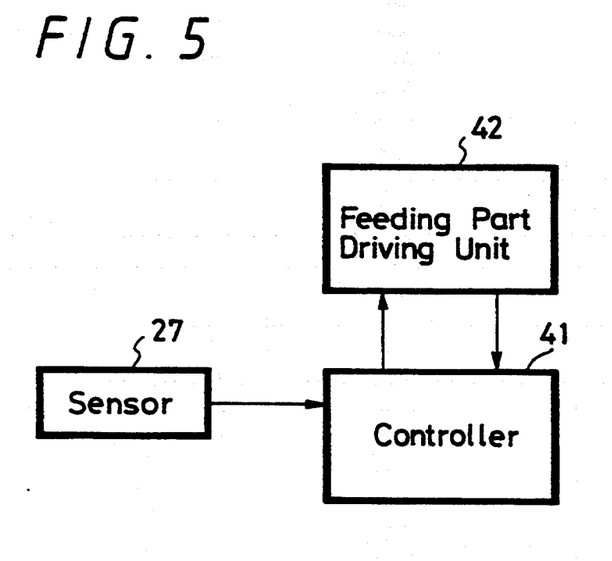
FIG. 5 shows in block form an arrangement of a control system for implementing the present invention.

In FIG. 5, the sensor 27 is a proximity sensor which is typically an ultrasonic sensor, but which may also be a light sensor for detecting light illuminated from a lower part (not shown), or other types of sensors. In any case, the sensor 27 provides the control system with information as to whether or not a printed wiring board is present beneath the current position of the sensor 27. The information may be in the form of a digital value "1" or "0," for example.

A feeding part driving unit 42, which preferably comprises a servo amplifier as a main component, electrically controls a mechanism associated with the printed wiring board feeding apparatus, including the feeding nails 21 or other portion of the apparatus.

A controller 41 is preferably comprised by a CPU, a sequencer or any other device which performs programmable arithmetic operations. The controller 41 is connected to the sensor 27 and to the feeding part driving unit 42, receives an output from the sensor 27, sends a movement command signal to the feeding part driving unit 42, and also receives information about the current position or other information on the feeding part.

Operation of the control system will next be described.

As has been explained above, the sensor 27 is attached to the feeding nail 21 and is moved together with the feeding nail 21. The sensor 27 provides the controller 41 with information as to whether or not a printed wiring board is present beneath its current position and this information is in the form of a "1" or a "0." As a result, the presence or absence of the printed wiring board can be confirmed in accordance with the movement of the feeding nail 21.

When the printed wiring board is now engaged with the stopper 29, the position of the back end of the board can be clearly confirmed based on the position of the feeding nail 21. Since the positional information of the feeding nail 21 at this time is held by the feeding part driving unit 42, the controller 41 calculates a size or length of the printed wiring board by receiving the information from the feeding part driving unit 42.

The controller 41 further calculates the aforementioned movement stroke based upon the calculated length of the board to determine a subsequent movement distance of the feeding part 19.

In the above-described embodiment, the sensor 27 has been described as detecting the size of the printed wiring board 10, and the controller calculates, based upon the detected value from the sensor 27, the movement stroke of the movable feeding part 19 or feeding nail 21 and controls the feeding part driving unit 42 based on the calculated movement stroke. However, when information as to the size or other information on the printed wiring board 10 is previously known, this information may be previously stored in a memory and the sensor 27 may be arranged to identify only the type or model of the printed wiring board 10. In the latter case, the sensor 27 supplies a command signal to the memory and then the memory supplies an instruction signal indicative of a movement stroke to the driving unit 42 of the feeding part 19.

While, in the above-described embodiment, the information on the printed wiring board 10 is detected to thereby control the movement stroke of the movable feeding part 19 or the feeding nail 21 based on the detected information, the information on the printed wiring board 10 may be utilized to automate the mounting operation of electric parts or other parts on the printed wiring board positioning unit 13.

In this case, for example, procedures for mounting electric parts or other parts on the printed wiring board may be previously stored in a suitable memory for all types of printed wiring boards 10. Then, the sensor 27 may read information on each of the printed wiring boards 10 to thereby identify the type or model of the printed wiring board 10 located in the printed wiring board positioning unit 13, whereby the mounting operation is carried out according to the type of the printed wiring board 10.

Having described the preferred embodiments of the invention with reference to the accompanying drawings, it is to be understood that the invention is not limited to the precise embodiments and that various changes and modifications thereof could be effected by one skilled in the art without departing from the spirit or scope of the novel concepts of the invention as defined in the appended claims.

What is claimed is:

1. A printed wiring board feeding apparatus for sequentially feeding printed wiring boards to a predetermined position, comprising:
   (a) a sensor for detecting information on each of the printed wiring boards;
   (b) feeding stroke determining means for separately determining a feeding stroke for each of said printed wiring boards based upon the information detected by said sensor; and
   (c) a feeding unit for feeding each of said printed wiring boards to said predetermined position based upon the feeding stroke determined by said feeding stroke determining means, said sensor being mounted to said feeding unit for movement therewith.

2. The printed wiring board feeding apparatus according to claim 1, said feeding unit comprising a nail for engaging an edge of each of said printed wiring boards when each of said printed wiring boards is fed to said predetermined position and wherein said sensor is attached to said nail.

3. The printed wiring board feeding apparatus according to claim 1, wherein said information detected by said sensor comprises a size of each of said printed wiring boards.

4. The printed wiring board feeding apparatus according to claim 1, wherein said information detected by said sensor for each of said printed wiring boards identifies each of said printed wiring boards.

5. The printed wiring board feeding apparatus according to claim 1, wherein said sensor comprises a proximity sensor for detecting the presence of each printed wiring board; and said feeding stroke determining means comprises a CPU for calculating a length of each printed wiring board and for determining said feeding stroke for each printed wiring board based upon said length.

6. A method for sequentially feeding printed wiring boards of different sizes to a predetermined position, comprising the steps of:
   (a) detecting a position of a printed wiring board before the printed wiring board is fed to said predetermined position;

(b) detecting a size of the printed wiring board in a feeding direction;

(c) setting a position of the printed wiring board after the printed wiring board has been fed to said predetermined position; and (d) setting a feeding stroke of the printed wiring board based upon the detected and set positions of the printed wiring board before and after the printed wiring board has been fed to said predetermined position respectively, and based upon the detected length of the printed wiring board in the feeding direction.

7. The method for sequentially feeding printed wiring boards as set forth in claim 6, wherein said step of detecting a size of said printed wiring board comprises the step of passing said printed wiring board over a sensor.

8. The method for sequentially feeding printed wiring boards as set forth in claim 6, wherein said step of detecting a size of said printed wiring board comprises the step of passing a sensor over said printed wiring board.

9. A method for sequentially feeding non-identical printed wiring boards to a position for processing, comprising the steps of:

(a) providing a feeding unit having a sensor mounted thereon;

(b) moving said feeding unit along with said sensor over the printed wiring board in a first direction opposite a feeding direction of the printed wiring board;

(c) detecting information of the printed wiring board with said sensor as said feeding unit and said sensor are moved in said first direction;

(d) engaging said printed wiring board with said feeding unit;

(e) moving said feeding unit along with said printed wiring board in a second direction opposite said first direction to position said printed wiring board in a position for processing according the information detected by said sensor.

10. The method for sequentially feeding non-identical printed wiring boards as set forth in claim 9, wherein said step of detecting information comprises detecting a size of the printed wiring board in a feeding direction.

11. The method for sequentially feeding non-identical printed wiring boards as set forth in claim 9, wherein said step of engaging said printed wiring board comprises engaging an edge of the printed wiring board with a nail of said feeding unit, said sensor being attached to said nail.

* * * * *